United States Patent [19]
Miura et al.

[11] Patent Number: 4,719,167
[45] Date of Patent: Jan. 12, 1988

[54] POSITIVE PHOTORESIST COMPOSITION WITH 1,2 NAPHTHOQUINONE DIAZIDE AND NOVOLAK RESIN CONDENSED FROM MIXTURE OF M-CRESOL, P-CRESOL, AND 2,5-XYLENOL WITH FORMALDEHYDE

[75] Inventors: Konoe Miura, Yokohama; Tameichi Ochiai, Sagamihara; Yasuhiro Kameyama, Yokohama, all of Japan

[73] Assignee: Mitsubishi Chemical Industries Ltd., Tokyo, Japan

[21] Appl. No.: 825,902

[22] Filed: Feb. 4, 1986

[30] Foreign Application Priority Data

Feb. 13, 1985 [JP] Japan .................... 60-25660

[51] Int. Cl.$^4$ ............................ G03C 1/60; G03C 1/54
[52] U.S. Cl. ................................. 430/192; 430/193; 430/326; 528/153; 534/557
[58] Field of Search .................. 430/192, 193, 326; 528/153; 534/557

[56] References Cited

U.S. PATENT DOCUMENTS

| | | | |
|---|---|---|---|
| 3,106,465 | 10/1963 | Neugebauer et al. | 430/193 |
| 4,275,139 | 6/1981 | Stahlhofer | 430/192 |
| 4,404,357 | 9/1983 | Taylor et al. | 528/153 |
| 4,424,315 | 1/1984 | Taylor et al. | 528/153 |
| 4,439,516 | 3/1984 | Cornigliaro et al. | 430/192 |
| 4,499,171 | 2/1985 | Hosaka et al. | 430/192 |
| 4,551,409 | 11/1985 | Gulla et al. | 430/192 |
| 4,587,196 | 5/1986 | Toukhy | 430/192 |

Primary Examiner—Charles L. Bowers, Jr.
Attorney, Agent, or Firm—Oblon, Fisher, Spivak, McClelland, & Maier

[57] ABSTRACT

Disclosed herein is a positive photoresist composition containing (a) a photosensitizer of 1,2-naphthoquinone diazides photosensitive-material comprising an ester of 2,3,4,4'-tetrahydroxybenzophenone in which on the average, not less than two hydroxy groups of 2,3,4,4'-tetrahydroxybenzophenone have been esterified by 1,2-naphthoquinonediazide-5-sulfonic acid and (b) a novolak resin obtained by condensing a mixture of m-cresol, p-cresol and 2,5-xylenol with formaldehyde.

3 Claims, 1 Drawing Figure

POSITIVE PHOTORESIST COMPOSITION WITH 1,2 NAPHTHOQUINONE DIAZIDE AND NOVOLAK RESIN CONDENSED FROM MIXTURE OF M-CRESOL, P-CRESOL, AND 2,5-XYLENOL WITH FORMALDEHYDE

BACKGROUND OF THE INVENTION

The present invention relates to a radiation-sensitive positive photoresist composition, and more in detail, a positive photoresist composition containing a novolak resin obtained by condensing a mixture of m-cresol, p-cresol and xylenol with formaldehyde and a specified 1,2-naphthoquinone diazide photosensitive-material.

The progress of the degree of integration of the integrated circuit has been accelerated yearly, and this is an age of so-called VLSI having the integrated circuit of the integration rate of higher than 100,000, wherein the design of 1.5 $\mu$m rule and further that of 1.0 $\mu$m rule is required.

Accompanying with the above-mentioned progress, the requirement for the photolithography technique has come to be strict year after year. In the photolithography technique, the hitherto used photoresist is the negative photoresist obtained by adding a photo-crosslinking agent, namely, a bisazide compound, to a cyclized polyisoprene rubber. However, the resolution of this photoresist is limited by the swelling of the photoresist when it is subjected to development, and it is difficult to obtain a resolution of higher than 3 $\mu$m.

The photoresist which can respond to the above-mentioned requirement is the positive photoresist. The positive photoresist composition contains an alkali-soluble phenols-formaldehyde-novolak resin together with a photosensitive substance, generally a substituted naphthoquinone diazide.

When naphthoquinone diazide is irradiated, it absorbs ultra-violet rays and is converted into a ketene via a carbene as follows.

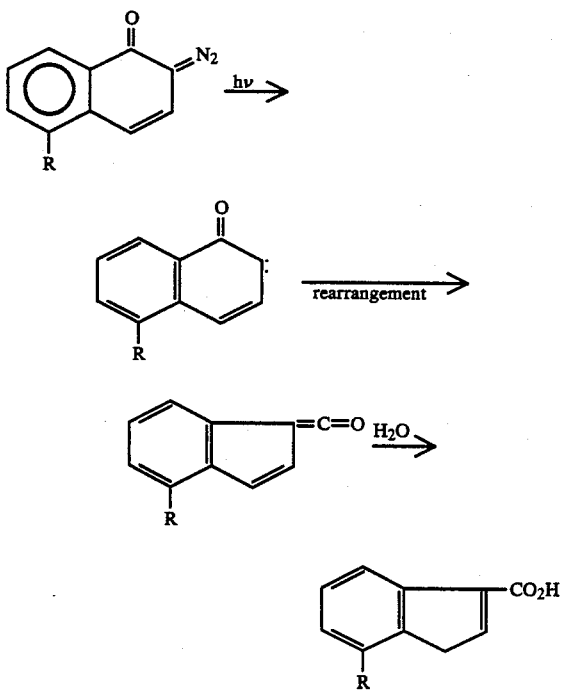

and the carbene reacts with water in the reaction system to form an indenecarboxylic acid. The positive photoresist utilizes the phenomenon that the thus formed indenecarboxylic acid dissolves in the aqueous alkaline solution of the developer.

As mentioned above, since the positive photoresist utilizes an aqueous alkali solution as the developer, the photoresist is not swollen in developing different from the case of the negative photoresist and accordingly, it is possible to improve the resolution.

Namely, the positive photoresist has developed as the photoresist showing the non-swelling and the high resolution as compared to the negative photoresist, and has been used to the VLSI of 2 $\mu$m rule.

However, along with the shrinking of the design of the VLSI to 1.5 $\mu$m rule and further to 1.0 $\mu$m rule, it has been elucidated that the form of the cross-section of the pattern of the conventional positive photoresist becomes narrower in the position near the upper surface and on the other hand, becomes wider in the position near the bottom, in other words, the photoresist has a pattern profile of a trapezoid.

Since the thickness of the membrane of the widened bottom part of the photoresist is small, such a thinner part of the membrane of the photoresist is also subjected to etching, and it is elucidated that the pattern has not enough to retain the dimension-reproducibility after etching. Accordingly, the offer of the photoresist which has the rectangular profile of the pattern even in the design of 1.5 to 1.0 $\mu$m rule has been keenly demanded.

However, the actual situation has been that a photoresist which fulfills the above-mentioned specificities and does not impair the other specificities such as the sensitivity, the low unexposed film-thickness loss after developing and the heat-resistance has not yet developed.

As a result of the present inventors' studies, it has been found that a positive photoresist composition showing an extremely excellent pattern profile and a high sensitivity without losing the various specificities of the conventional positive photoresist is available by combining a specified photosensitive material of 1,2-naphthoquinone diazides with a specified novolak resin, and the present invention has been attained based on the findings.

SUMMARY OF THE INVENTION

In an aspect of the present invention, there is provided a positive photoresist composition containing (a) a photosensitizer of 1,2-naphthoquinone diazides photosensitive-material comprising an ester of 2,3,4,4'-tetrahydroxybenzophenone in which on the average, not less than two hydroxy groups of 2,3,4,4'-tetrahydroxybenzophenone have been esterified by 1,2-naphthoquinonediazide-5-sulfonic acid and (b) a novolak resin obtained by condensing a mixture of m-cresol, p-cresol and 2,5-xylenol with formaldehyde.

BRIEF DESCRIPTION OF DRAWING

Of the attached drawing.

DETAILED DESCRIPTION OF THE INVENTION

Figure 1:
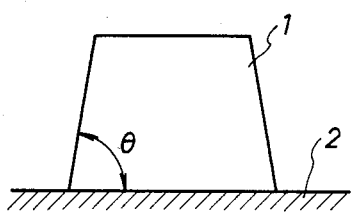
FIG. 1 shows an illustration of the state of the photoresist according to the present invention placed on a silicone wafer.

The novolak resin according to the present invention is obtained by condensing a mixture of m-cresol, p-cresol and 2,5-xylenol, preferably a mixture of 10 to 80 mol% of m-cresol, 10 to 80 mol% of p-cresol and 10 to 80 mol % of 2,5-xylenol, and more preferably a mixture of 10 to 50 mol% of m-cresol, 40 to 80 mol% of p-cresol and 10 to 50 mol% of 2,5-xylenol with formaldehyde according to the known method using known acid catalyst For instance, after reacting a mixture of the respectively predetermined amounts of m-cresol, p-cresol and 2,5-xylenol with formaldehyde for 0.5 to 15 hours at a temperature in the range of 50° to 200° C. in the presence of an acid catalyst such as oxalic acid, hydrochloric acid, phosphoric acid and the like, the reaction mixture is further heated at a temperature in the range of 100° to 250° C. under a reduced pressure, thereby removing water and unreacted monomers from the reaction system and obtaining the novolak resin easily.

Of the thus obtained novolak resins, those showing a weight-average molecular weight represented by the converted value of polyetyrene (by using gel-permeation chromatography) of 1,000 to 30,000, preferably 1,500 to 15,000 and more preferably 2,000 to 10,000 are suitably used according to the present invention.

As the photosensitive material of 1,2-naphthoquinone diazides, an ester of 2,3,4,4'-tetrahydroxybenzophenone in which on the average, not less than two hydroxy groups of 2,3,4,4'-tetrahydroxybenzophenone have been esterified by 1,2-naphthoqinone diazide-5-sulfonic acid, preferably on the average, not less than 2.5 and not more than 3.5 hydroxy groups of 2,3,4,4'-tetrahydroxybenzophenone have been esterified, and more preferably, on the average, not less than 2.7 and not more than 3.3 hydroxy groups of 2,3,4,4'-tetrahydroxybenzophenone have been esterified, is used. The ester of a higher esterification is less soluble in a solvent, and on the other hand, in the case of using the ester of a lower esterification, the fractional film thickness remaining of unexposed area after developing is reduced though the apparent sensitivity of the photoresist is higher as compared to the ester of not less than 2 hydroxy groups esterification.

The above-mentioned photosensitive material may be easily synthesized by a known method in which 2,3,4,4'-tetrahydroxybenzophenone and a predetermined amount of 1,2-naphthoquinone diazide-5-sulfonyl chloride are reacted in the presence of a base in a solvent such as dioxane, cellosolve, acetone and the like. The esterification can be determined by liquid-chromatography according to the conventional method.

The weight ratio of the photosensitive material of 1,2-naphthoquinone diazides to the novolak resin in the positive photoresist composition according to the present invention (hereinafter referred to as the present composition) is in the range of 15/100 to 35/100, preferably 18/100 to 30/100, and both the two components of the present composition are mixed together after respectively dissolving in a suitable solvent. As the solvent, there is no restriction if the solvent does not react to the novolak resin and the photosensitive material, has a sufficient solubilizing power and gives a favorable film-forming property to the two components, and the solvents of cellosolves such as methylcellosolve, ethylcellosolve, butylcellosolve, methylcellosolve acetate, ethylcellosolve acetate and the like, the solvents of esters such as butyl acetate, amyl acetate and the like, the high polar solvents such as dimethylformamide, dimethylsulfoxide and the like, mixed solvents thereof or mixtures of aromatic hydrocarbon(s) and the mixed solvent may be exemplified.

After applying the photoresist composition on a base plate by a known method, the thus coated base plate is exposed with electromagnetic waves of wavelength below that of visible light in a predetermined pattern and by developing the thus exposed plate, a favorable relief image of photoresist can be obtained.

As the developing liquid for the positive photoresist composition according to the present invention, an aqueous solution of an inorganic alkali such as sodium hydroxide, potassium hydroxide, sodium carbonate, sodium silicate, sodium metasilicate, aqueous ammoniacal solution and the like, a primary amine such as ethylamine, n-propylamine and the like, a secondary amine such as diethylamine, di-n-propylamine and the like, a tertiary amine such as triethylamine, methyldiethylamine and the like, or a quaternary ammonium compound such as tetramethylammonium hydroxide, trimethylhydroxyethylammonium hydroxyoxide and the like or a mixture of the aqueous solution of inorganic alkali, primary amine, secondary amine, tertiary amine or quaternary amine with an alcohol or a surfactant may be used.

The positive photoresist composition according to the present invention is useful not only for producing the VLSI but also for producing the general IC and further for producing masks or for offset printing.

The photoresist composition according to the present invention is excellent in the physical properties such as sensitivity, heat-resistance, and very low film thickness loss at unexposed area after development and the photoresist composition is suitably used in the development of VLSI, etc.

The present invention will be explained more in detail while referring to the following non-limitative examples.

SYNTHETIC EXAMPLE 1

After heating a mixture of 200 mmol of m-cresol, 400 mmol of p-cresol and 160 mmol of 2,5-xylenol to 85° C. under agitation, an aqueous solution of 8.87 mmol of oxalic acid in 45 ml of an aqueous 37 % solution of formaldehyde was added dropwise to the thus heated mixture in 20 min, and after finishing the addition, the mixture was reacted for 5 hours at 85° C.

After finishing the reaction, water and the unreacted monomers were distilled off from the reaction mixture under a reduced pressure while raising the bath temperature slowly, the final temperature being 160° C. under a pressure of 10 mmHg, and the thus formed product was left to self-cooling to obtain 71 g of the novolak resin. The weight average molecular weight of the thus obtained novolak resin measured by gel-permeation chromatography was 3660 as a converted value of polystyrene.

SYNTHETIC EXAMPLE 2

Into 340 ml of a mixed solvent (13:4 by volume) of dioxane and N-methylpyrrolidone, 18 g of 2,3,4,4'-tetrahydroxybenzophenone and 59 g of 1,2-naphthoquinone diazide-5-sulfonyl chloride were dissolved, and into the thus formed solution, a solution of 22.2 g of triethylamine in 60 ml of dioxane was added dropwise under agitation. Then the reaction mixture was added into water, and the thus formed esterified product was collected by filtration. The esterified product was washed with methanol and vacuum-dried to obtain the esterified 2,3,4,4'-tetrahydroxybenzophenone in which, on the average, three hydroxy groups had been esterified.

EXAMPLE

Formulation of a Photoresist Composition

Into 10 ml of ethylcellosolve acetate, 3 g of the novolak resin synthesized in Synthetic Example 1 and 0.77 g of the ester of 2,3,4,4'-tetrahydroxybenzophenone esterified by 1,2-naphthoquinonediazide-5-sulfonic acid synthesized in Synthetic Example 2 were dissolved, and by subjecting the thus prepared solution to fine filtration while using a teflon ® membrane filter (made by SUMITOMO Electric Industries, Ltd. of 0.2 μm in pore size), a photoresist composition according to the present invention was prepared.

After applying the thus prepared photoresist composition onto a silicone wafer of 4 inch in diameter, at a thickness of 1.03 μm while using a spin-coating apparatus (made by MIKASA CO., Ltd. Model H-2) and prebaking the thus applied composition for 1 min at 92° C., the thus coated silicone wafer was exposed by a reduction step-and-repeat system (made by GCA Co., Ltd. Model: DSW) and developed for one min at 25° C. by a positive developer (made by TOKYO OHKA Co., Ltd., Model NMD-3).

From the thus prepared photoresist, a cross-section of the pattern including the line and space of 1.0 μm was cut out, and the evaluation of the shape of the photoresist was carried out by the angle between the wall surface of the photoresist (shown by 1 in FIG. 1) and the flat surface of the silicone wafer (shown by 2 in FIG. 1) while using a scanning electron microscope (×10,000, made by AKASHI Works, Ltd., Model: SIGMA II), the angle being shown by θ in FIG. 1.

Sensitivity of the photoresist is defined by the reciprocal of the number of seconds for exposing which reproduce the mask-pattern of 2.0 μm, and the fractional film thickness remaining is represented by the ratio (percentage) of the unexposed area before and after developing. The heat-resistance of the photoresist is represented by the temperature just before the beginning of the resist flow when the cross-section of the line and space of 1.0 μm is observed through a scanning electron microscope after post-baking the photoresist at various temperature.

The results of determination of the specific properties of the photoresist prepared in Example are shown in Table 1.

COMPARATIVE EXAMPLE

The photoresist composition prepared by (1) dissolving 3 g of a novolak resin of weight average molecular weight of 15,000, synthesized from m-cresol, p-cresol and formaldehyde by the same method in Synthetic Example 1 and 0.43 g of an ester of 2,3,4-trihydroxybenzophenone esterified by 3 mols of 1,2-naphthoquinonediazide-5-sulfonic acid into 10 ml of ethylcellosolve acetate and (2) subjecting the thus formed solution to fine filtration of 0.2 μm was evaluated by the same procedures in Example. The results are also shown in Table 1.

TABLE 1

|  | Composition of novolak resin (% by weight) | Photosensitive Material | θ (°) | Sensitivity[1] | Fractional film thickness remaining (%) | Heat-resistance (°C.) |
| --- | --- | --- | --- | --- | --- | --- |
| Example | m-cresol: 26 p-cresol: 53 2,5-xylenol: 21 | 1,2-naphthoquinonediazide-5-sulfonate of 2,3,4,4'-tetrahydroxybenzophenone | 86 | 1.8 | 97 | 150 |
| Comparative Example | m-cresol: 60 p-cresol: 40 | 1,2-naphthoquinonediazide-5-sulfonate of 2,3,4-trihydroxybenzophenone | 74 | 1.0 | 95 | 150 |

Note: [1]The definition of "sensitivity" has been shown in Example, and the data is represented by the comparative value to Comparative Example.

What is claimed is:

1. A positive photoresist composition consisting essentially of an admixture of (a) a photosensitizer of 1,2-naphthoquinone diazides photosensitive-material comprising an ester of 2,3,4,4'-tetrahydroxybenzophenone in which on the average, not less than two hydroxy groups of 2,3,4,4'-tetrahydroxybenzophenone have been esterified by 1,2-naphthoguinonediazide-5-sulfonic acid in a photosensitizing amount, and (b) a novolak resin obtained by condensing a mixture of about 10 to 80 mol percent m-cresol, about 10 to 80 mol percent p-cresol and about 10 to 80 mol percent 2,5-xylenol with formaldehyde, wherein the weight ratio of (a) to (b) is 15–35 parts to 100 parts.

2. A positive photoresist composition according to claim 1, wherein the weight-average molecular weight of said novolak resin is in the range of 1,000 to 30,000.

3. A positive photoresist composition according to claim 1, wherein said 1,2-naphthoquinone diazides photosensitive-material is an esterified 2,3,4,4'-tetrahydroxybenzophenone by 1,2- naphthoquinonediazide-5-sulfonicacid in which on the average, 2.5 to 3.5 of the hydroxy group of 2,3,4,4'-tetrahydroxybenzophenone have been esterified.

* * * * *